United States Patent
Zhou et al.

(10) Patent No.: US 12,525,987 B2
(45) Date of Patent: Jan. 13, 2026

(54) SYSTEM FOR AND METHOD OF ANALOG TO DIGITAL CONVERSION USING CALIBRATION

(71) Applicant: Avago Technologies International Sales Pte. Limited, Singapore (SG)

(72) Inventors: Jun Zhou, Irvine, CA (US); Hongwu Chi, Palo Alto, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 248 days.

(21) Appl. No.: 18/361,649

(22) Filed: Jul. 28, 2023

(65) Prior Publication Data

US 2025/0038758 A1    Jan. 30, 2025

(51) Int. Cl.
  *H03M 1/10*  (2006.01)
  *H03M 1/34*  (2006.01)
  *H03M 1/40*  (2006.01)
  *H03M 3/00*  (2006.01)

(52) U.S. Cl.
  CPC ....... *H03M 1/1023* (2013.01); *H03M 1/1014* (2013.01); *H03M 1/34* (2013.01); *H03M 1/40* (2013.01); *H03M 3/384* (2013.01); *H03M 3/386* (2013.01); *H03M 3/402* (2013.01); *H03M 3/458* (2013.01)

(58) Field of Classification Search
  CPC .... H03M 1/1023; H03M 3/458; H03M 3/386; H03M 3/402; H03M 3/384; H04B 1/40
  See application file for complete search history.

(56) References Cited

U.S. PATENT DOCUMENTS

| | | | |
|---|---|---|---|
| 8,532,225 B2 * | 9/2013 | O'Keeffe | H04L 25/062 |
| | | | 455/313 |
| 8,643,518 B2 * | 2/2014 | da Silva | H03M 3/386 |
| | | | 341/120 |

FOREIGN PATENT DOCUMENTS

EP    4 080 771 A1    10/2022

OTHER PUBLICATIONS

Foreign Search Report on non-Foley case related to US dtd Dec. 23, 2024.
Julien Ryckaert et al: "A 6.1 GS/s 52.8 mW 43 dB DR 80 MHz bandwidth 2.4 GHz RF bandpass [Delta] [Sigma] ADC in 40 nm CMOS", Radio Frequency Integrated Circuits Symposium (RFIC), 2010 IEEE, IEEE, Piscataway, NJ, USA, May 23, 2010 (May 23, 2010), pp. 443-446, XP031684195, ISBN: 978-1-4244-6240-7 * sections I, III, V; figures 1-5.

* cited by examiner

*Primary Examiner* — Khai M Nguyen
(74) *Attorney, Agent, or Firm* — Foley & Lardner LLP

(57) ABSTRACT

The systems and methods discussed herein related to analog to digital conversion. An apparatus can include an analog to digital converter including a loop circuit and a comparator circuit. The apparatus can also include a first circuit configured to provide comparator offset calibration for the comparator circuit and a second circuit configured to provide loop calibration for the loop circuit.

20 Claims, 6 Drawing Sheets

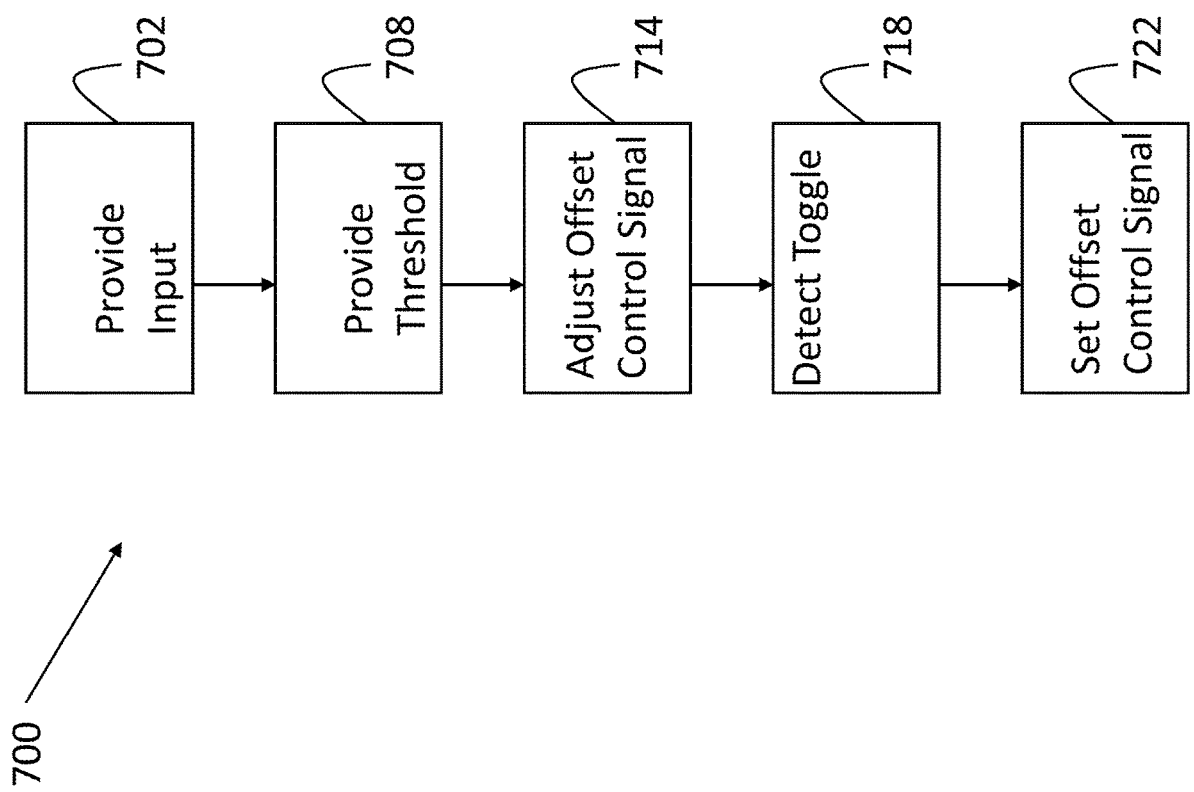

SYSTEM FOR AND METHOD OF ANALOG TO DIGITAL CONVERSION USING CALIBRATION

FIELD OF THE DISCLOSURE

This disclosure generally relates to systems for and methods of compensation or calibration in analog to digital conversion operations or analog to digital converters (ADCs) including but not limited ADCs used in transceivers.

BACKGROUND

In the last few decades, the market for integrated circuit (IC) devices has grown by orders of magnitude, fueled by the need for portable devices, and increased connectivity and data transfer between all manners of devices. Analog to digital conversion operations are widely used in integrated circuit (IC) devices. ADCs are often provided in communication circuits as well as other types of circuits that use both analog and digital signals. In some applications, radio frequency transmitters used in wireless base stations include ADCs. The ADCs convert electrical analog signals into digital signals for wireless and wired communications or processing. For example, wireless communication systems may operate in accordance with one or more standards, including, but not limited to, IEEE 802.11, Bluetooth, LTE, 6G, etc. The accuracy of the conversion of analog signals into digital signals can affect the speed, accuracy, and robustness of communications.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 6 is flow diagram showing comparator offset calibration operations for the analog to digital conversion system illustrated in FIG. 1 according to some embodiments.

DETAILED DESCRIPTION

Figure 1:
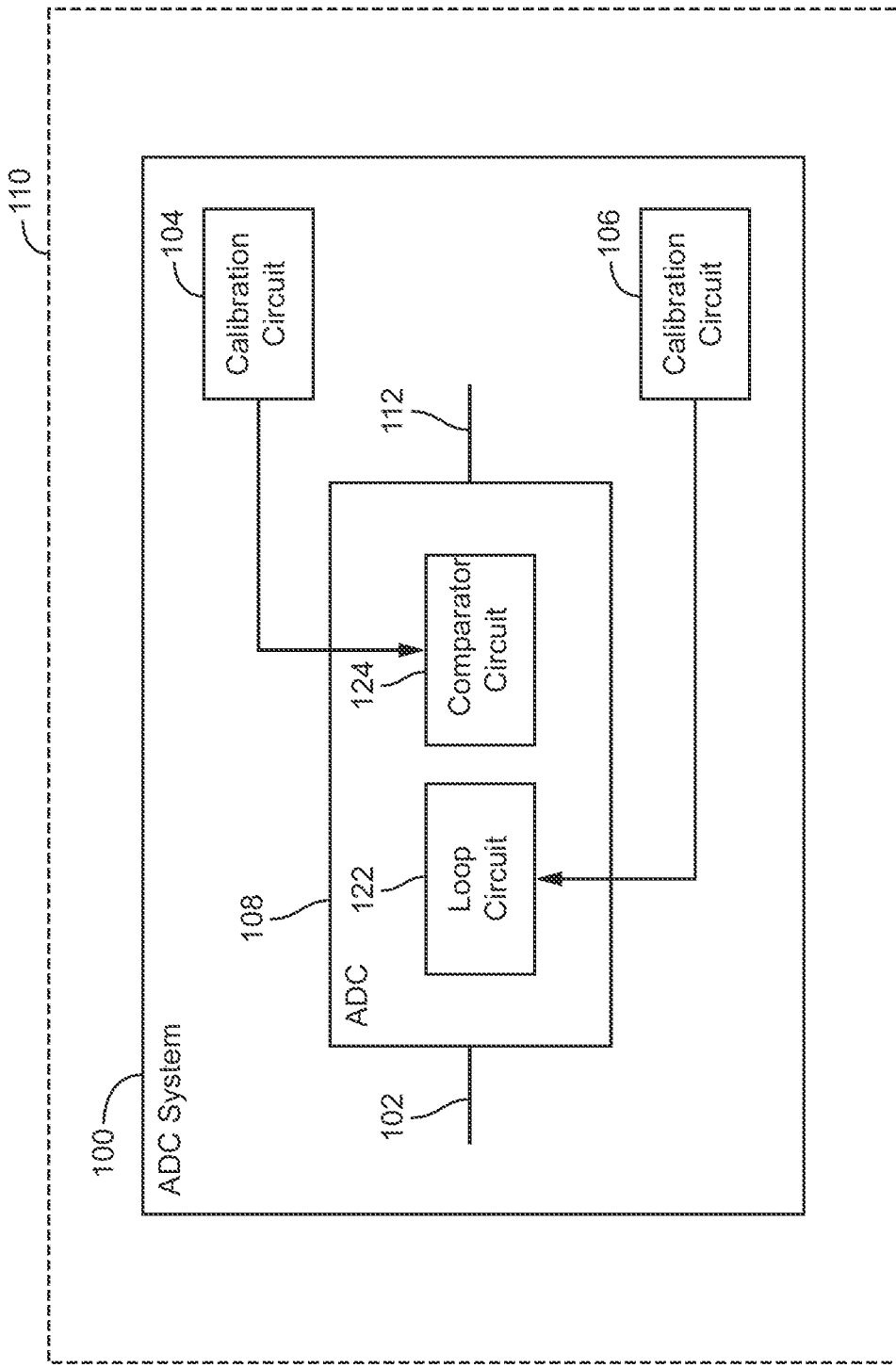
FIG. 1 is a general schematic block diagram of an analog to digital conversion system according to some embodiments.

Analog to digital converters (ADCs) are utilized in various wireless and wired communication devices as well as other mixed signal systems. ADCs are also used in processors, microcontrollers, sensors, and other circuits that receive or process analog signals and transmit or process digital signals. In some embodiments, integrated circuits (ICs) for WiFi and Bluetooth wireless devices (including but not limited to cellular phones, tablets, watches, headsets, computers, sensors, etc.) use one or more ADCs. The ICs can include ICs used in combination 7 nm WiFi and Bluetooth applications.

Calibration hardware and associated algorithms for a wideband sigma-delta ADC can ensure accuracy for robust analog to digital conversion. In some embodiments, the ADC can be used in a high-performance WiFi and Bluetooth combination device. In some embodiments, the ADC is a flash sigma-delta ADC that is robust with respect to the process-voltage-temperature (PVT) variations in some embodiments. A precise on-chip calibration scheme can be used to fine tune all or most major components in a sophisticated, wide band ADC design in some embodiments.

Systems and methods of ADC calibration provide a reliable calibration while keeping the chip area overhead small in some embodiments. In some embodiments, the systems and methods execute a robust calibration algorithm on-chip that balances the calibration time, chip performance and yield rate. An external device such as signal generator or a stable signal input and spectrum analyzer is not required for the calibration operations in some embodiments. In some embodiments, a calibration engine and any related software are completely embedded on chip or within a package of the ADC (e.g., within a system on a chip (SoC) solution) and provide a fast robust calibration operation. In some embodiments, a fully on-chip calibration engine uses a small chip area and optimizes the calibration time and yield rate. On-chip may refer to the inclusion of an operation or circuit within an integrated circuit package (e.g., a single package or a multichip module) in some embodiments.

In some embodiments, systems and methods employ a two-step calibration scheme. The calibration scheme includes a comparator offset calibration and a loop calibration (e.g., filter resistor capacitor (RC) calibration) in some embodiments. The comparator offset calibration uses an on-chip digital-to-analog converter (DAC) that tests for a scalable DC signal to complete the comparator offset calibration in some embodiments. The loop calibration configures an on-chip operational amplifier and loop filter for resonance or oscillation in some embodiments. A digital module is used to compute the period of oscillation in some embodiments.

An operational flow for an ADC automatically performs the comparator offset calibration and loop calibration in some embodiments. The systems and methods sweeps the ADC in full scale to find optimal offset values in the comparator offset calibration in some embodiments. The loop calibration obtains an optimal capacitor value for tuning the oscillation signal to a pole frequency in some embodiments. In some embodiments, a fully on-chip calibration engine for a wideband ADC including a stable and scalable input source and a high resolution amplitude and frequency analyzer is provided. In some embodiments, the systems and methods use a reconfigurable architecture to reuse the key analog components in a calibration mode. The switch between a calibration mode and an operation mode is controlled by software settings.

Some embodiments relate to an apparatus. The apparatus includes an analog to digital converter including a loop circuit and a comparator circuit. The apparatus also includes a first circuit configured to provide comparator offset calibration for the comparator circuit and a second circuit configured to provide loop calibration for the loop circuit.

In some embodiments, the second circuit includes a frequency estimator and an analyzer. The analyzer receives a frequency measurement from the frequency estimator for the loop circuit and adjusts resistance or capacitance in the loop circuit. In some embodiments, the apparatus is part of a transceiver provided in a single IC package. In some embodiments, the analyzer receives a first frequency measurement from the frequency estimator for a first stage of the loop circuit, adjusts resistance or capacitance of the first stage, receives a second frequency measurement from the frequency estimator for a second stage of the loop circuit, and adjusts resistance or capacitance of the second stage in the loop circuit. In some embodiments, the second circuit adjusts a capacitance of the loop circuit or a stage of the loop circuit.

In some embodiments, the first circuit is configured to detect toggling of a comparator output. In some embodiments, the comparator circuit includes seven one bit comparators.

Some embodiments relate to analog to digital converter. The analog to digital converter includes a loop circuit and a first circuit. The loop circuit has a first stage and a second stage. The first circuit is configured to provide loop calibration for the first stage and loop calibration for the second stage.

In some embodiments, the first circuit includes a frequency estimator and an analyzer. The analyzer receives a first frequency measurement from the frequency estimator for the first stage and adjusts resistance or capacitance in the first stage. In some embodiments, the analyzer receives a second frequency measurement from the frequency estimator for the second stage and adjusts resistance or capacitance in the second stage.

In some embodiments, the analog to digital converter further includes an IC package containing the first circuit and the loop circuit. In some embodiments, the analog to digital converter further includes a comparator circuit coupled to the second stage. In some embodiments, the analog to digital converter further includes a second circuit configured to provide comparator offset calibration for the comparator circuit.

In some embodiments, the second circuit is configured to detect toggling of a comparator output. In some embodiments, the first circuit adjusts a capacitance of the first stage.

Some embodiments relate to a method. The method includes providing comparator offset calibration for a comparator circuit of an analog to digital converter using on-chip circuitry. The method also includes providing loop calibration for a loop circuit of an analog to digital converter using the on-chip circuitry.

In some embodiments, the loop calibration for the loop circuit uses a frequency estimator and an analyzer. The analyzer receives a first frequency measurement from the frequency estimator for a first stage of the loop circuit and adjusts resistance or capacitance in the first stage.

In some embodiments, the comparator circuit and the loop circuit are in an in-phase path. In some embodiments, the comparator circuit and the loop circuit are in a quadrature path. In some embodiments, the comparator offset calibration includes detecting toggling of a comparator output.

With reference to FIG. 1, an ADC system 100 is provided on a physical (PHY) chip or integrated circuit (IC) in a package 110. Package 110 can be part of a communication system or device, a computing device, a sensing device, etc. In some embodiments, ADC system 100 is a one chip design and can be used in transceivers for cellular, WiFi and Bluetooth applications. The ADC system 100 can be a radio frequency ADC device. The systems and methods described herein with respect to ADC system 100 can be used for a variety of different ADC architectures in a wide range devices including but not limited to devices used in high-speed and high-resolution applications.

ADC system 100 includes a calibration circuit 104, a calibration circuit 106 and an ADC 108. ADC system 100 receives an analog signal at an input 102 and provides a digital signal at an output 112. The analog input signal can be an in-phase or quadrature phase signal of an RF modulated signal. The digital signal can be a 3-bit signal. ADC system 100 can be part of a larger device and external hardware is not required in some embodiments. The device and package 110 can include more than one ADC system 100 (e.g., one for each channel) in some embodiments.

ADC 108 is a flash ADC in some embodiments. The ADC 108 can be a current mode or voltage mode conversion circuit. ADC 108 is a sigma delta ADC (e.g., flash sigma delta ADC) in some embodiments. ADC 108 can be a first order, second order or other order ADC in some embodiments. ADC 108 can also include a decimator, filters, switches, oscillators, and other circuit components. ADC 108 is a voltage mode ADC and includes a loop circuit 122 and a comparator circuit 124 in some embodiments. Loop circuit 122 is configured to perform delta sigma processing on the analog signal at the input 102, and comparator circuit 124 is configured to compare the output of the loop circuit 122 to a threshold to provide digital bits as the output signal at digital output 108.

Loop circuit 122 is an operational amplifier circuit with a feedback loop in some embodiments. Loop circuit 122 can include a digital to analog converter, a differentiator, a filter, a summer, an integrator, resistive and/or capacitive components, switches, and other components in some embodiments. The loop circuit 122 can be in various configurations including one or more feedback networks with passive and active components coupled to an operational amplifier.

The comparator circuit 124 is an operational amplifier based comparator circuit in some embodiments. Comparator circuit 124 include a set of comparators, each configured to compare an input signal to a respective threshold in some embodiments. Comparator circuit 124 can include a filter (e.g., digital), a threshold circuit, resistive and/or capacitive components, switches, and other components in some embodiments. Comparator circuit 124 can include a logic circuit to convert the output of the comparators to a digital word. The comparator circuit 124 can be in various configurations including one or more comparators coupled to receive a respective threshold voltage associated with the analog to digital conversion operation.

Calibration circuit 104 is configured to calibrate comparator circuit 124. Calibration circuit 104 is configured to compensate for comparator offsets associated with comparator circuit 124 in some embodiments. Comparator offsets may refer to errors associated with mismatches between the threshold voltage and the voltage at which a comparator changes its output in some embodiments. Comparator offsets may be caused by comparator design, temperature changes, processing variations, power supply variations, etc. Calibration circuit 104 is configured to provide adjustments to accommodate the comparator offsets (e.g., to decrease mismatch error). In some embodiments, the calibration circuit 104 is a digital engine that computes the average of ADC output over a configurable time interval and searches for an optimal offset value that centers the ADC output in the desired range.

In some embodiments, calibration circuit 104 is configured for use with a high speed comparator that has a large direct current (DC) offset that can degrade quantizer linearity and can cause non-monotonicity. In some embodiments, the calibration circuit 104 can accommodate about a 25 mV/sigma comparator offset. In some embodiments, the calibration circuit 104 uses a feedback DAC to sweep the flash quantizer input voltage at threshold levels and adjust individual comparator offsets to bring flash comparators to toggling at these threshold levels. In some embodiments, a first stage of the loop circuit 122 is powered down, and a second stage of the loop circuit 122 is set in bypass mode to set up a predefined DC gain for the feedback DAC. In some embodiments, the digital input to the feedback DAC is varied (Din change) to change the input to the quantizer. The excess loop delay (ELD) is also changed to match data input change (e.g. in an override mode) in some embodiments.

Calibration circuit 106 is configured to calibrate loop circuit 122. Calibration circuit 106 is configured to adjust the resonant condition of loop circuit 122 in some embodiments. For example, with an ideal operational amplifier, the resonant condition is defined by $C_1/C_2=(R_1-R_2)/R_1$ and the resonant frequency $w=1/SQR\ (C_1C_2R_1R_2)$. $C_1$ and $C_2$ represent capacitance values in that loop and can be reflective of serial or parallel capacitors as well as inherent capacitance in the loop. $R_1$ and $R_2$ represent resistance values in that loop and can be reflective of serial or parallel resistors as well as inherent resistance in the loop.

With limited gain band width (LGBW) and direct current (DC) gain of the operational amplifier, the above equations can deviate from an ideal calculation. Applying off chip RC calibration can be used to reach a correct resonant frequency ω. Matching can be relied upon to guarantee or obtain an improved resonant condition. However, due to the high speed nature of wide band ADCs, parasitics may become significant and are process dependent so that the improved resonant condition degrades.

Calibration circuit 106 is configured to perform an in-circuit or on-chip calibration to reduce the degradation in some embodiments. In some embodiments, calibration circuit 106 is configure to program values for C1 and C2, for R1 and R2, or both, to detect oscillation, and to measure oscillation frequency. When using a 3-bit quantizer, both oscillation detection and frequency measurement is performed in the digital domain, thereby reducing analog complexity (and thus parasitics) for an improved a high speed, lower resolution ADC in some embodiments.

Figure 2:
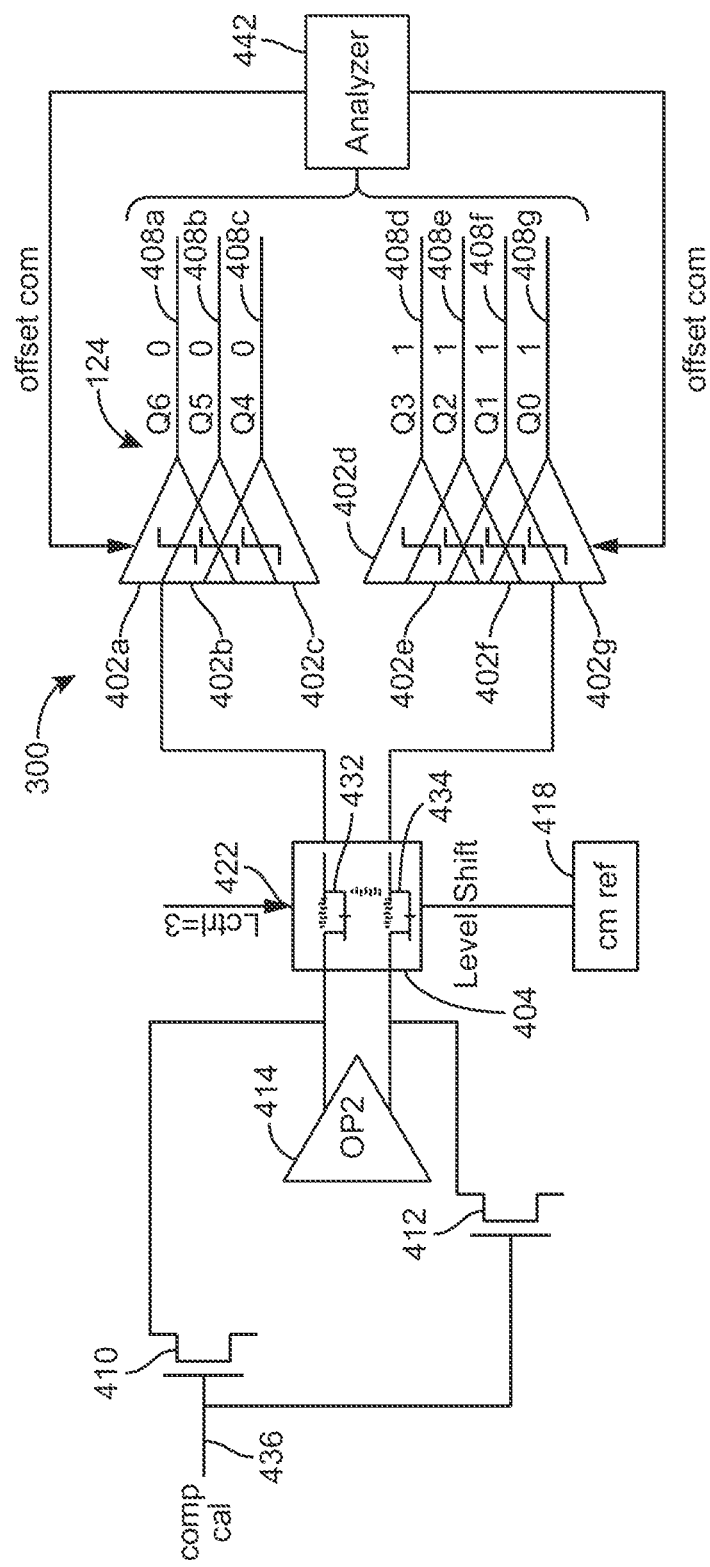
FIG. 2 is a more detailed schematic block diagram of a portion of the analog to digital conversion system illustrated in FIG. 1 used for a comparator offset calibration operation according to some embodiments.

With reference to FIG. 2, a comparator offset calibration operation is explained below referencing a circuit 300 which includes portions of ADC 108. The comparator offset calibration operation can be performed by calibration circuit 104. Comparator offset calibration may refer to any adjustment to a comparator circuit intended to reduce error in some embodiments. The error can be an offset error or mismatch error associated with the comparator circuit 124. The calibration can set comparator offset control signals to reduce mismatch error in some embodiments.

Circuit 300 includes a set of comparators 402*a-g* (e.g., 1 bit comparators), a level shift circuit 404, a switch 410, a switch 412, a comparator reference circuit 418, an analyzer 442, and an amplifier 414 in some embodiments. Amplifier 414 is part of loop circuit 122 in FIG. 1 (e.g., a second stage of loop circuit 122). In some embodiments, the set of comparators 402*a-g* is for an in-phase (I) path or a quadrature (Q) path. Comparators 402*a-g*, level shift circuit 404, and a comparator reference circuit 418 are part of comparator circuit 124 in FIG. 1 in some embodiments. Comparators 402*a-g* are operational amplifiers without feedbacks loops having a non-inverting input coupled to receive a signal from amplifier 414 and an inverting input coupled to receive a particular threshold voltage in some embodiments. Logic is used to convert the output signals at outputs 408 *a-g* of comparators 402*a-g* to a three bit signal (representing 8 levels).

The level shift circuit 404 provides a corresponding level for each amplifier 402*a-g* to the non-inverting input in a calibration mode. The level shift circuit 404 is configured to provide the corresponding voltage level to match the threshold voltage for each of comparators 402*a-g* during calibration. The level shift circuit 404 is used to provide signals at particular voltage levels from comparator reference circuit 418 in response to a control signal at input 422. Level shift circuit 404 can be a multiplexer or switch matrix that selects particular threshold voltages from amplifier 414 and from comparator reference circuit 418 in some embodiments.

Comparator reference circuit 418 provides accurate voltage levels. Comparator reference circuit 418 can utilize any of a number of techniques to provide reference voltages. In some embodiments, comparator reference circuit 418 includes a DAC and provides analog voltage levels in response to bit values. For example, a 4 bit DAC can provide voltage levels corresponding to values (e.g., 10, 8, 6, 4, 7, 9 and 11) for comparators 402*g-a*, respectively. Resistive ladders, regulators, and other devices can be used to provide signals at various voltage levels in some embodiments. Signals from amplifier 414 are passed through level shift circuit 404 to the non-inverting input of comparators 402*a-g* in some embodiments. Level shift circuit 404 provides the differential signal from amplifier 414 as a single ended signal to comparators 402*a-g* using switches 432 and 434 in some embodiments. In some embodiments, a respective same signal is provided to the non-inverting input and the non-inverting output of each comparator 402*a-g* in the calibration mode.

Level shift circuit 404 includes a switch 432 and 434. Switches 432 and 434 can each be a transistor or a network of transistors. In some embodiments, the ADC 108 is a current mode ADC and the threshold voltages are threshold currents and the levels provided by the level shift circuit 404 are current levels.

Switches 410 and 412 are configured to place amplifier 414 in a calibration mode. In some embodiments, switches 410 and 412 bring the differential outputs of amplifier 414 to ground during a calibration operation in response to a calibration control signal at an input 436. Switches 410 and 412 can each be a transistor or a network of transistors.

Analyzer 442 is an on-chip circuit in the calibration circuit 104 which is configured to receive outputs from comparators 402*a-g* and provide adjustments to comparators to reduce mismatch errors. Analyzer 442 is configured to detect when the signals at outputs 408*a-g* toggle or oscillate between a logic high and logic low. Analyzer 442 can utilize a state circuit to detect if the output state is changing in rapid succession to detect toggle in some embodiments (e.g., comparing previous value to the current value in succession to determine toggling). In some embodiments, analyzer 442 includes an averaging circuit which averages each respective signal at respective outputs over time to determine toggling. A value of 0.5 over time indicates toggling. When a respective output 408*a-g* toggles, the threshold voltage is equal to the voltage level provided by the level shift circuit 404. In the calibration mode, the level shift circuit 404 provides a signal at the signal input that is equal to the threshold voltage. The signal input can be provided by a DAC (e.g. on-chip DAC 624) in some embodiments. The analyzer 442 adjusts the offset control signal of each comparator 402*a-g* across a range until the respective output 408*a-g* toggles. The offset control signal is set to that that level, thereby tuning the comparator to the appropriate threshold voltage. The offset control signal is received by the offset adjustment circuit internal to ADC 108 in some embodiments.

In some embodiments, the analyzer 442 increases the offset control signal until the respective output signal changes from a logic low to a logic high. The analyzer 442 then decreases the offset control signal until the output signal changes from a logic level low. The analyzer 442 repeats these operations until the output signal toggles and then sets the offset control signal to the current level. In some embodiments, a respective offset control signal is determined for each of comparators 402*a-g* for each I and Q path (e.g., 14 total).

Figure 3:
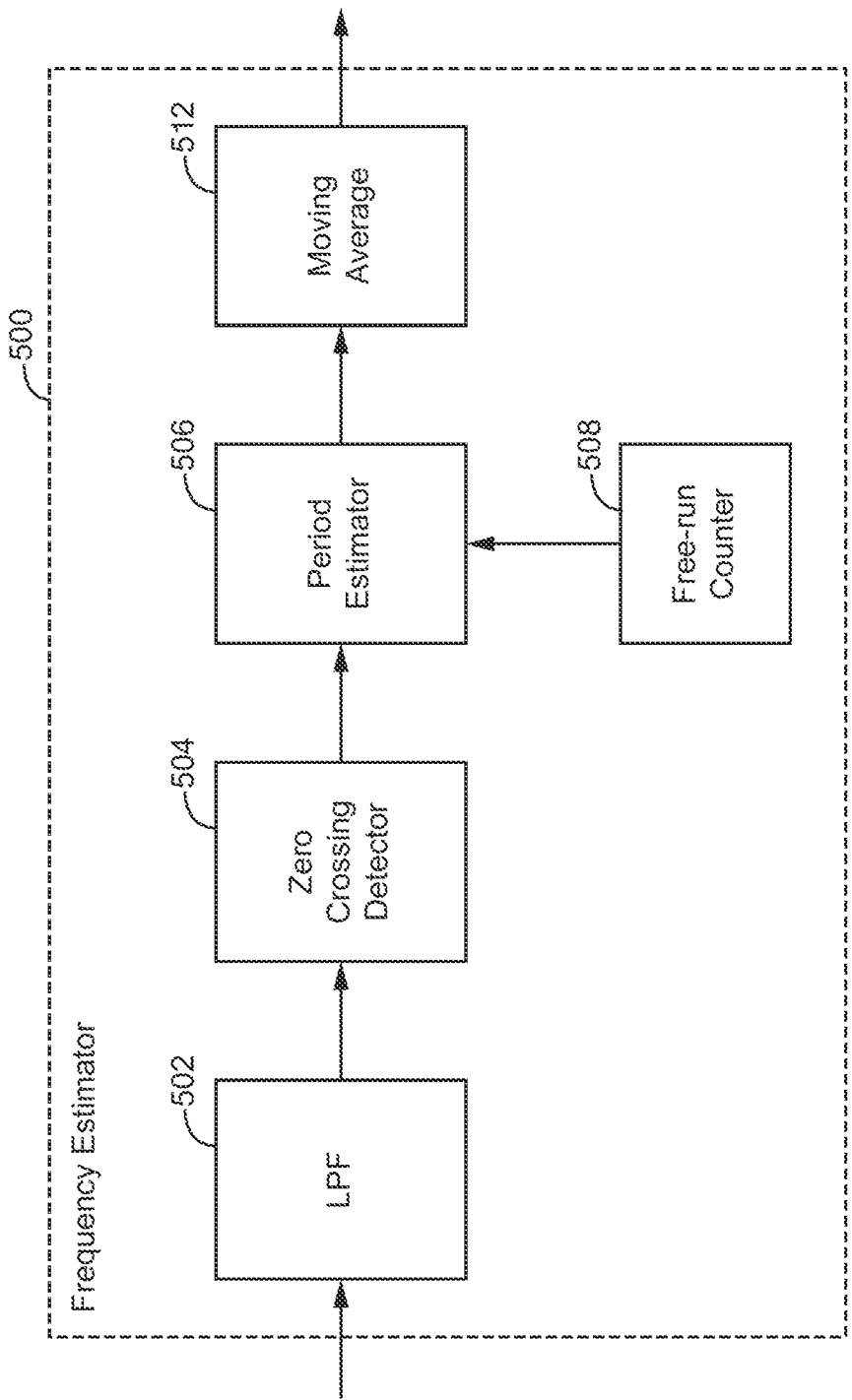
FIG. 3 is a schematic block diagram of a frequency estimator for the analog to digital conversion system illustrated in FIG. 1 according to some embodiments.

With reference to FIG. 3, ADC system 108 (FIG. 1) includes a frequency detector or estimator 500 (e.g., as part of calibration circuit 106) in some embodiments. In some embodiments, frequency estimator 500 is an off-chip or an on-chip circuit. Frequency detector or estimator 500 includes a low pass filter 502, a zero crossing detector 504, a period estimator 506, a free run counter 508, and a moving average circuit 512. Low pass filter 502 filters the signal from the operational amplifier of loop circuit 122 (e.g., amplifier 414 (FIG. 2)). The filtered signal is provided to zero crossing detector 504. Zero crossing detector 504 is configured to provide a signal when the filtered signal crosses a threshold (e.g., zero volts). The zero crossing detector 504 can be an operational amplifier based circuit. The signals from zero crossing detector 504 are provided to period estimator 506 which estimates the period between signals from the zero crossing detector 504 using values from free run counter 508. The period estimator 506 can be configured to sample the value in free run counter 508 on every pulse from zero crossing detector 504 and subtract succeeding values to estimate the period of the signal. Free run counter 508 counts the number of clock pulses received at its clock input. Moving average circuit 512 receives the difference values from period estimator 506 to determine an average frequency of the signal received by filter 502. Calibration circuit 106 uses this average period or frequency value to adjust the loop circuit 122 in some embodiments. The loop circuit 122 can be adjusted to provide the appropriate resonance frequency.

Figure 4:
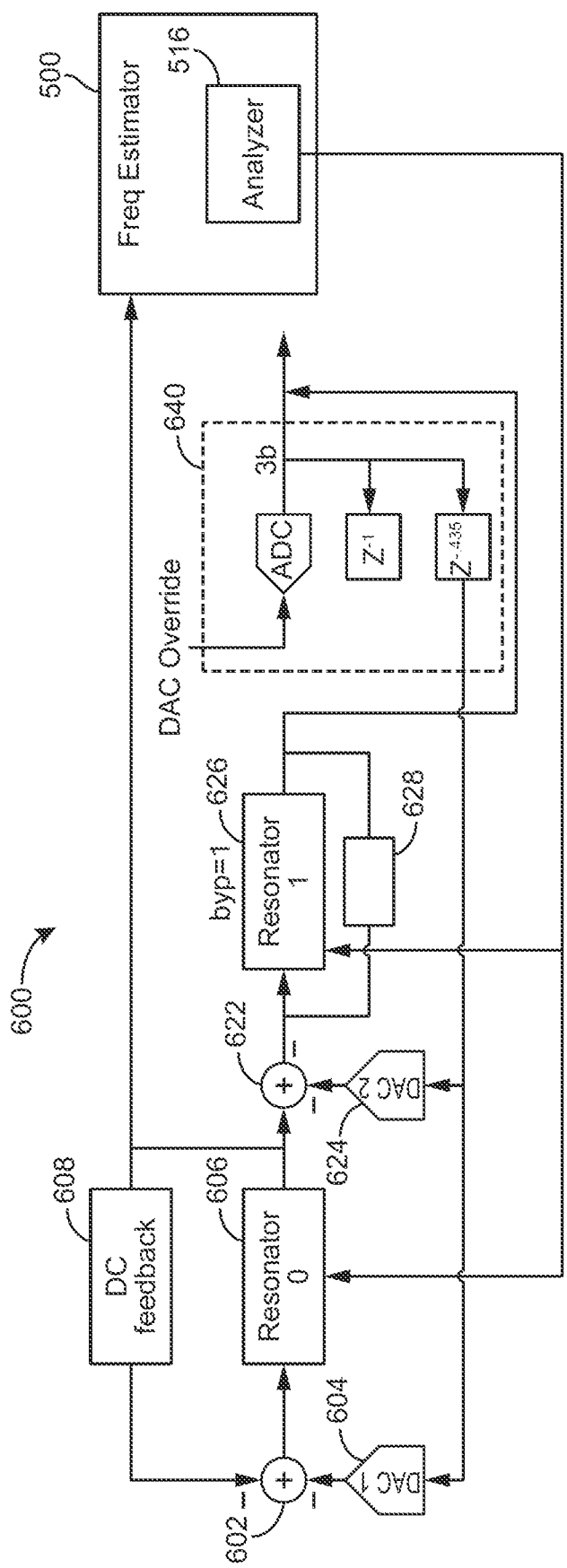
FIG. 4 is a more detailed schematic block diagram of a portion of the analog to digital conversion system illustrated in FIG. 1 configured for a first stage loop calibration operation according to some embodiments.

With reference to FIG. 4, a first stage of a circuit 600 is in a calibration mode. The loop calibration operation for the first stage and the second stage can be performed by calibration circuit 106. Circuit 600 can be part of loop circuit 122 (FIG. 1). Loop calibration may refer to any adjustment to a loop circuit or stage thereof intended to adjust a resonant frequency of the loop circuit or stage thereof in some embodiments. The adjustment can be made by increasing or decreasing resistance and/or capacitance in the loop circuit or stage thereof in some embodiments. The first stage of circuit 600 includes a DAC 604, a summer 602, a DC feedback circuit 608, and a resonator 606. The second stage of circuit 600 includes a DAC 624, a summer 622, and a resonator 626. The loop calibration operation for the first stage and the second stage can be performed by calibration circuit 106. Each stage has a pole frequency for resonance in some embodiments. A stage may refer to a portion of circuit in some embodiments. A first stage may have similar components and connections to a second stage, and the first stage and second stage may be coupled in a series, cascade or parallel orientation in some embodiments.

A switch 628 is configured to disconnect resonator 626 when in the calibration mode for the first stage. In the calibration mode, a DAC override is performed so that a signal from ADC feedback circuit 640 is not provided to DAC 604 and DAC 624. DC feedback circuit 608 provides DC feedback to summer 602 which is provided to resonator 606. The DC feedback is provided because global feedback is not available in the calibration mode. A switch 628 bypasses resonator 626.

Circuit 640 is can be comparator circuit 124 (FIG. 1) or portion thereof and provides a digital feedback signal to DACS 604 and 624 for application to summers 602 and 604 in normal operation. The DAC override can be performed by setting the DAC input value to a certain value (e.g., 000, 1111) in some embodiments. In the calibration mode for the first stage, analyzer 516 of frequency estimator 500 determines the frequency of the signal provided by resonator 606 and adjusts the capacitance (e.g., capacitance $C_1$ and $C_2$ in resonator 606) until the proper resonant frequency is reached in some embodiments. Trial and error methods can be used by adjusting values of capacitance $C_1$ and $C_2$ in some embodiments. The capacitance $C_1$ and $C_2$ is adjusted by adjusting variable capacitors or selecting capacitive paths in resonator 606 in some embodiments. In some embodiments, combinations of values for $C_1$ and $C_2$ are selected on a trial and error basis. In some embodiments, the desired resonant frequency is 35 MHz for the first stage. The calibration can be performed for I and Q paths in some embodiments.

Figure 5:
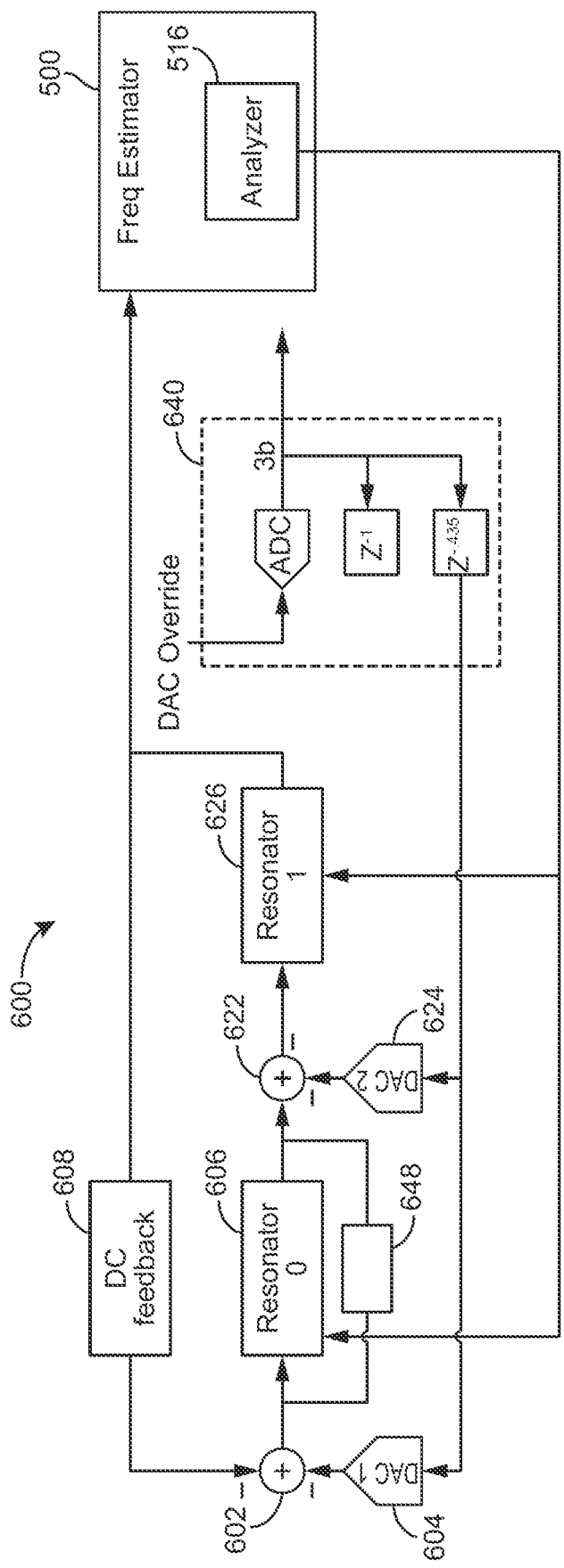
FIG. 5 is a more detailed schematic block diagram of a portion of the analog to digital conversion system illustrated in FIG. 1 configured for a second stage loop calibration operation according to some embodiments.

With reference to FIG. 5, while in the calibration mode for the second stage, a switch 648 is configured to disconnect resonator 606. In the calibration mode for the second stage, a DAC override is performed as described above. DC feedback circuit 608 provides DC feedback to summer 602 which is provided to resonator 626. In the calibration mode for the second stage, analyzer 516 of frequency estimator 500 determines the frequency of the signal provided by resonator 626 and adjusts the capacitance (e.g., capacitance $C_1$ and $C_2$ in resonator 626) until the proper resonant frequency is reached in some embodiments. Analyzer 516 of frequency estimator 500 determines the frequency of the signal provided by resonator 626 and adjusts the capacitance (e.g., capacitance $C_1$ and $C_2$ in resonator 626) until the proper resonant frequency is reached for the second stage in some embodiments. In some embodiments, the desired resonant frequency is 13.8 MHz for the first stage. Trial and error methods can be used by adjusting values of capacitance $C_1$ and $C_2$ using similar techniques to those described above with respect to resonator 606 in some embodiments.

A loop circuit may refer to a feedback circuit that includes resistors and/or capacitors and that has a characteristic resonance frequency related to values of the resistors and/or capacitors in some embodiments. A comparator circuit may refer to that receives a signal, compares the signal to another signal, and provides an output related to the comparison. A comparator circuit can include one or more operational amplifiers configured to compare an analog signal to a threshold voltage or current and provide a digital output. A frequency estimator may refer to any circuit configured to provide a measurement or estimate of frequency or a period of a signal (e.g., a signal in a loop circuit) in some embodiments. An analyzer may refer to any circuit configured to receive a measurement signal and provide a control signal in some embodiments. An analyzer can be a circuit that receives a frequency measurement and provides a calibration control signal to adjust a loop circuit or a stage of a loop circuit in some embodiments. An analyzer can be a circuit that receives an output signal and adjusts an offset control signal to adjust a comparator circuit in some embodiments.

The calibration can be performed for I and Q paths in some embodiments. In some embodiments, the second stage is calibrated before the first stage. In some embodiments, the second stage is calibrated before the first stage for I and Q paths followed by calibration of the first stage for I and Q paths. In some embodiments, the I and Q paths are calibrated in parallel for both the comparator offset and loop calibration. An in phase path may refer to circuitry for receiving and/or processing an in-phase signal in some embodiments. A quadrature path may refer to circuitry for receiving and/or processing a quadrature signal in some embodiments.

In some embodiments, the digital components of ADC system 100 can be implemented using dedicated or non-dedicated circuits or processor based circuits including, but not limited to: a central processing unit (CPU), graphics processing unit (GPU), microprocessor, application specific integrated circuit (ASIC), a field programmable gate array (FPGA), complementary metal-oxide-semiconductor (CMOS), or the like. In some examples, a memory for storing data and computer instructions is included, such as random-access memory (RAM), read-only memory (ROM), programmable read-only memory (PROM), erasable programmable read-only memory (EPROM), and electrically erasable programmable read-only memory (EEPROM), dynamic random-access memory (DRAM), static random-access memory (SRAM), Flash memory, or the like. For example, all or parts of the implementations may be circuitry that includes a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof.

The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. The integrated circuit package can be a combination of two or more packages in some embodiments.

An operational amplifier may refer to an amplifier with a gain and an input impedance in some embodiments. The gain and input impedance can be relatively high in some embodiments. An operational amplifier can have inverting and non-inverting inputs and outputs for performing operations on an input voltage in some embodiments. Operational amplifiers generally operate according to a current rule where no current flow into the inverting and non-inverting inputs and a voltage rule where the output of the operational amplifier attempts to ensure that the voltage difference between the inverting and non-inverting inputs is zero in some embodiments. An inverting input may refer to a circuit input where changes in a signal at a non-inverting output are 180 degrees out of phase from changes at the inverting input in some embodiments. A non-inverting input may refer to a circuit input where changes in a signal at the non-inverting input are 180 degrees out of phase from changes at the inverting output in some embodiments. A non-inverting output may refer to a circuit output where changes in a signal at an inverting input are 180 degrees out of phase from changes at the non-inverting output in some embodiments.

An inverting output may refer to a circuit output where changes in a signal at a non-inverting input are 180 degrees out of phase from changes at the inverting output in some embodiments. Non-inverting inputs and outputs are marked with a positive sign and inverting inputs and outputs are marked with a negative sign in some embodiments.

A switch may refer to any type of switching device including but not limited to transistors in some embodiments. A transistor may refer to any type of transistors including field effect transistors FETS, insulated gate FETs, bipolar junction transistors, etc. In some embodiments, the transistors are P-channel or N-channel metal oxide semiconductor field effect transistors (MOSFETs). A P-channel transistor includes a P channel, which is a channel composed of a majority of hole current carriers, between its source and drain. An N-channel transistor includes an N channel, which is a channel composed of a majority of electron current carriers, between its source and drain. The terms drain and source may be used interchangeably and may refer to a region of a transistor in some embodiments. A gate may refer to a transistor structure for controlling opening (e.g., towards a non-conductive state) and closing (e.g., towards a conductive state) of a transistor in some embodiments.

ADC system 100 can be used in various operating environment as with system components (e.g., hardware elements) of other devices. ADC system 100 can be used in network environment includes a wired or a wireless communication system that includes one or more access points, one or more wireless communication devices which can include transceivers and a network hardware component. The network environment can include (DOCSIS) modems that enable high-bandwidth data transfer via existing coaxial cable systems associated with the transmission of cable television program signals (CATVS). The wireless communication devices may for example include access points, cellular nodes, televisions, laptop computers, tablets, personal computers and/or cellular telephone devices. The network environment can be an ethernet, an ad hoc network environment, an infrastructure wireless network environment, a subnet environment, satellite network, cellular network, WiFi network, etc. in some embodiments.

The access points (APs) may be operably coupled to the network hardware via local area network connections. The network hardware, which may include a router, gateway, switch, bridge, modem, system controller, appliance, etc., may provide a local area network connection for the communication system. Each of the access points may have an associated antenna or an antenna array to communicate with the wireless communication devices in its area. The wireless communication devices may register with a particular access point to receive services from the communication system (e.g., via a SU-MIMO or MU-MIMO configuration). For direct connections (e.g., point-to-point communications), some wireless communication devices may communicate directly via an allocated channel and communications protocol. Some of the wireless communication devices may be mobile or relatively static with respect to the access point.

The ADC system 100 can include central processing unit and digital signal processors which can be any logic circuitry that responds to and processes instructions fetched from a memory in some embodiments. Memory can be any type or variant of static random access memory (SRAM), Dynamic random access memory (DRAM), Ferroelectric RAM (FRAM), NAND Flash, NOR Flash and Solid State Drives (SSD).

With reference to FIG. 6, an exemplary comparator offset calibration flow 700 can be performed by calibration circuit 104 (FIG. 1). Calibration circuit 104 provides an input signal at a level of a threshold voltage of one of comparators 408a-g (FIG. 2) in an operation 702 in some embodiments. Calibration circuit 104 provides a threshold voltage to one of comparators 408a-g (FIG. 2) in an operation 708 in some embodiments. The threshold voltage and the level of the input signal are equal in some embodiments. The signals for operations 708 and 714 can be provided by a DAC (DACS 602 and 604) and switches 432 and 434 (FIG. 2) can provide the connections for providing the appropriate signals in some embodiments. At an operation 714, the offset control signals are adjusted while the output of the comparator is monitored for toggling. When toggling is detected (e.g., using an average circuit that indicates a value of 0.5 over a time period) at an operation 718, the offset control signal is set at that level in an operation 722 in some embodiments. Flow 700 can be repeated for each of comparators 408a-g (FIG. 2) in some embodiments.

Any implementation disclosed herein can be combined with any other implementation, and references to "an implementation," "some embodiments," "an alternate implementation," "various implementation," "one implementation" or the like are not necessarily mutually exclusive and are intended to indicate that a particular feature, structure, or characteristic described in connection with the implementation can be included in at least one implementation. Such terms as used herein are not necessarily all referring to the same implementation. Any implementation can be combined with any other implementation, inclusively or exclusively, in any manner consistent with the aspects and embodiments disclosed herein. In the above description, for the purposes of explanation, numerous details are set forth to provide a thorough understanding of the described embodiments. It will be apparent to one skilled in the art, however, that other embodiments may be practiced without some of these details. In other instances, structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features. Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present. Circuit or circuitry may refer to any active or passive component and connections thereto as well as combinations thereof. Circuitry may further include or access instructions (e.g., software or firmware instructions) for execution by the circuitry. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. The integrated circuit package can be a combination of two or more packages in some embodiments.

Although examples of communications systems described above may include devices and APs operating according to an 802.11 standard, it should be understood that embodiments of the systems and methods described can operate according to other standards and use wireless communications devices other than devices configured as devices and APs. For example, multiple-unit communication interfaces associated with cellular networks, satellite communications, vehicle communication networks, and other non-802.11 wireless networks can utilize the systems and methods described herein to achieve improved overall capacity and/or link quality without departing from the scope of the systems and methods described herein.

It should be noted that certain passages of this disclosure may reference terms such as "first" and "second" in connection with devices, mode of operation, transmit chains, loops, etc., for purposes of identifying or differentiating one from another or from others. These terms are not intended to merely relate entities (e.g., a first device and a second device) temporally or according to a sequence, although in some cases, these entities may include such a relationship. Nor do these terms limit the number of possible entities (e.g., devices) that may operate within a system or environment.

It should be understood that the systems described above may provide multiple ones of any or each of those components and these components may be provided on either a standalone machine or, in some embodiments, on multiple machines in a distributed system. In addition, the systems and methods described above may be provided as one or more computer-readable programs or executable instructions embodied on or in one or more articles of manufacture. The article of manufacture may be a floppy disk, a hard disk, a CD-ROM, a flash memory card, a PROM, a RAM, a ROM, or a magnetic tape. In general, the computer-readable programs may be implemented in any programming language, such as LISP, PERL, C, C++, C#, PROLOG, or in any byte code language such as JAVA. The software programs or executable instructions may be stored on or in one or more articles of manufacture as object code.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

The transmitter and analog to digital conversion system have been described above with the aid of functional building blocks illustrating the performance of certain significant functions. The boundaries of these functional building blocks have been arbitrarily defined for convenience of description. Functions and structures can be integrated together across such boundaries. Alternate boundaries could be defined as long as the certain significant functions are appropriately performed. Similarly, flow diagram blocks may also have been arbitrarily defined herein to illustrate certain significant functionality. To the extent used, the flow boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. An apparatus, comprising:
   an analog to digital converter comprising a loop circuit and a comparator circuit;
   a first circuit configured to provide comparator offset calibration for the comparator circuit; and
   a second circuit configured to provide loop calibration for the loop circuit, the second circuit comprising:
      a frequency estimator; and
      an analyzer configured to:
         receive a first frequency measurement from the frequency estimator for a first stage of the loop calibration;
         adjust a resistance or a capacitance of the first stage of the loop calibration;
         receive a second frequency measurement from the frequency estimator for a second stage of the loop calibration; and
         adjust a resistance or a capacitance of the second stage of the loop calibration.

2. The apparatus of claim 1, wherein the apparatus is part of a transceiver provided in a single integrated circuit (IC) package.

3. The apparatus of claim 1, wherein the first circuit is configured to detect toggling of a comparator output.

4. The apparatus of claim 1, wherein the comparator circuit comprises seven one bit comparators.

5. The apparatus of claim 1, wherein the second circuit is configured to:
   adjust a capacitance of the loop circuit; or
   adjust a stage of the loop calibration.

6. An analog to digital converter, comprising:
   a loop circuit having a first stage and a second stage; and
   a first circuit configured to provide loop calibration for the first stage and loop calibration for the second stage, and the first circuit comprising:
      a frequency estimator; and
      an analyzer configured to:
         receive a first frequency measurement from the frequency estimator for the first stage;
         adjust a resistance or a capacitance in the first stage;
         receive a second frequency measurement from the frequency estimator for the second stage; and
         adjust a resistance or a capacitance in the second stage.

7. The analog to digital converter of claim 6, further comprising an integrated circuit (IC) package containing the first circuit and the loop circuit.

8. The analog to digital converter of claim 6, further comprising:
   a comparator circuit coupled to the second stage.

9. The analog to digital converter of claim 8, further comprising:
   a second circuit configured to provide comparator offset calibration for the comparator circuit.

10. The analog to digital converter of claim 9, wherein the second circuit is configured to detect toggling of a comparator output.

11. The analog to digital converter of claim 6, wherein the first circuit adjusts a capacitance of the first stage.

12. The analog to digital converter of claim 6, further comprising a comparator circuit.

13. The analog to digital converter of claim 12, further comprising a second circuit configured to provide comparator offset calibration for the comparator circuit.

14. The analog to digital converter of claim 13, wherein the second circuit is configured to detect toggling of a comparator output.

15. The analog to digital converter of claim 12, wherein the comparator circuit comprises seven one bit comparators.

16. The analog to digital converter of claim 6, wherein the analog to digital converter is part of a transceiver provided in a single IC package.

17. A method comprising:
   providing comparator offset calibration for a comparator circuit of an analog to digital converter using on-chip circuitry; and
   providing loop calibration for a loop circuit of the analog to digital converter using the on-chip circuitry, and the on-chip circuitry comprising:
      a frequency estimator; and
      an analyzer configured to:
         receive a first frequency measurement from the frequency estimator for a first stage of the loop calibration;
         adjust a resistance or a capacitance in the first stage;
         receive a second frequency measurement from the frequency estimator for a second stage of the loop calibration; and
         adjust a resistance or a capacitance in the second stage.

18. The method of claim 17, wherein the comparator circuit and the loop circuit are in an in-phase path.

19. The method of claim 17, wherein the comparator circuit and the loop circuit are in a quadrature path.

20. The method of claim 17, wherein the comparator offset calibration comprises detecting toggling of a comparator output.

* * * * *